(12) United States Patent
Ohkubo

(10) Patent No.: US 7,964,960 B2
(45) Date of Patent: Jun. 21, 2011

(54) SEMICONDUCTOR DEVICE HAVING NON PARALLEL CLEAVAGE PLANES IN A SUBSTRATE AND SUPPORTING SUBSTRATE

(75) Inventor: Noboru Ohkubo, Kumagaya (JP)

(73) Assignees: Sanyo Electric Co., Ltd., Moriguchi-shi (JP); Sanyo Semiconductor Co., Ltd., Gunma (JP)

( * ) Notice: Subject to any disclaimer, the term of this patent is extended or adjusted under 35 U.S.C. 154(b) by 111 days.

(21) Appl. No.: 12/500,735

(22) Filed: Jul. 10, 2009

(65) Prior Publication Data
US 2010/0013056 A1    Jan. 21, 2010

(30) Foreign Application Priority Data

Jul. 16, 2008 (JP) .................................. 2008-185190

(51) Int. Cl.
*H01L 23/34* (2006.01)
*H01L 21/00* (2006.01)

(52) U.S. Cl. ........ 257/723; 257/783; 438/107; 438/455; 438/462

(58) Field of Classification Search .................. None
See application file for complete search history.

(56) References Cited

U.S. PATENT DOCUMENTS

| | | | | |
|---|---|---|---|---|
| 7,759,779 B2 * | 7/2010 | Okada et al. | ................... | 257/678 |
| 2004/0137723 A1 * | 7/2004 | Noma et al. | ................... | 438/667 |
| 2005/0048740 A1 * | 3/2005 | Noma et al. | ................... | 438/460 |
| 2008/0258258 A1 * | 10/2008 | Horikoshi et al. | ............ | 257/532 |
| 2009/0050996 A1 * | 2/2009 | Liu et al. | ........................ | 257/434 |

FOREIGN PATENT DOCUMENTS

JP    2008-130768    6/2008

* cited by examiner

*Primary Examiner* — Alonzo Chambliss
(74) *Attorney, Agent, or Firm* — Morrison & Foerster LLP

(57) ABSTRACT

The invention prevents a fracture parallel to a cleavage plane of a supporting substrate along a groove formed in the supporting substrate before dicing. A supporting substrate is attached to a front surface of a semiconductor substrate formed with an electronic device with an adhesive layer being interposed therebetween. In this supporting substrate, dicing lines are not parallel with cleavage planes which are perpendicular to the front surface of supporting substrate, i.e., a fifth cleavage plane and a sixth cleavage plane crossing perpendicularly thereto. A groove is then formed in the supporting substrate from the front surface to the middle thereof in the direction perpendicular to the front surface, along the dicing lines inside an opening provided in the semiconductor substrate. This groove is not parallel with the fifth cleavage plane and the sixth cleavage plane. After given processes, dicing is performed to the layered body of layers from the semiconductor substrate to the supporting substrate along the dicing lines.

3 Claims, 6 Drawing Sheets

SEMICONDUCTOR DEVICE HAVING NON PARALLEL CLEAVAGE PLANES IN A SUBSTRATE AND SUPPORTING SUBSTRATE

CROSS-REFERENCE OF THE INVENTION

This application claims priority from Japanese Patent Application No. 2008-185190, the content of which is incorporated herein by reference in its entirety.

BACKGROUND OF THE INVENTION

1. Field of the Invention

The invention relates to a semiconductor device and a method of manufacturing the same, particularly, a semiconductor device manufactured by forming a groove in a semiconductor substrate from the front surface to the middle thereof in the direction perpendicular to the front surface and performing dicing thereto in a subsequent process, and a method of manufacturing the same.

2. Description of the Related Art

A chip size package is receiving attention in recent years as a new packaging technology. The chip size package is a small package having almost the same outside dimensions as those of a semiconductor die packaged in it.

Hereafter, an example of a structure of a BGA type semiconductor device which is one of the chip size packages will be described. As shown in FIG. 10, pad electrodes 112 are formed on a front surface of a semiconductor substrate 110 formed with an electronic device 110D with an insulation film 111 being interposed therebetween. A supporting substrate 114 made of single crystal silicon is attached to the front surface of this semiconductor substrate 110 so as to face it with an adhesive layer 113 being interposed therebetween. Openings 110A are then formed in the semiconductor substrate 110 along dicing lines DL. An insulation film 115 is then formed so as to cover the back surface of the semiconductor substrate 110 to the openings 110A. The pad electrodes 112 are then partially exposed, and wirings 116 are formed on the insulation film 115 so as to be connected to the exposed parts of the pad electrodes 112 and extend onto the back surface of the semiconductor substrate 110.

Then, grooves 117 are formed in the supporting substrate 114 from the front surface to the middle thereof in the direction perpendicular to the front surface, along the dicing lines DL inside the openings 110A. A protection film 118 is then formed so as to cover the back surface of the semiconductor substrate 110 to the grooves 117. Bump electrodes 119 are then formed so as to be connected to the wirings 116 through openings provided in the protection film 118. When this semiconductor device is mounted on electronic equipment, the electronic device 110D and an external circuit (not shown) mounted on a circuit board (not shown) such as a printed circuit board are electrically connected by connecting the bump electrodes 119 to a wiring pattern (not shown) on the circuit board.

A BGA type semiconductor device is described in Japanese Patent Application Publication No. 2008-130768.

In the method of manufacturing the semiconductor device described above, however, when the grooves 117 are formed in the supporting substrate 114, a region 114A of the supporting substrate 114 which is on an extension of the tip of the groove 117 may crack due to stress by contact of a dicing blade (not shown) to cause a fracture 114C separating the supporting substrate 114. The fracture 114C along the groove 117 of the supporting substrate 114 may also occur not only due to the stress by the contact of the dicing blade but also due to some stress occurring in the supporting substrate 114 in the process of forming the grooves 117 and processes after the formation of the grooves 117, for example, stress during handling.

It is conceivable that such a fracture 114C is caused by the fact that the dicing lines DL and dicing lines crossing perpendicularly thereto (not shown) extend in a direction that is parallel with cleavage planes of the crystal lattice structure of silicon, i.e., the face-centered cubic lattice structure, and the grooves 117 extend along these dicing lines DL.

Therefore, the supporting substrate 114 which is not to be diced at this time is practically diced along the dicing lines DL, and the protection film 118, the bump electrodes 119 and so on which need be formed after the formation of the grooves 117 can not be formed, thereby decreasing the yield of semiconductor devices.

SUMMARY OF THE INVENTION

The invention provides a method of manufacturing a semiconductor device. The method includes providing a semiconductor substrate having electronic devices formed on the front surface thereof, attaching a supporting substrate made of a single crystal semiconductor to the semiconductor substrate using an adhesive, forming an opening in the semiconductor substrate, forming at the opening of the semiconductor substrate a groove so as to cut perpendicularly into the supporting substrate attached to the semiconductor substrate, forming a protection film so as to cover a back surface of the semiconductor substrate and the groove of the supporting substrate, and cutting the protection film and the supporting substrate along the groove. In the plan view of the supporting substrate, the groove extends along a direction that is not parallel with a cleavage plane of the supporting substrate. The supporting substrate may be made of a single crystal silicon and formed by cutting along a cleavage plane.

The invention also provides a semiconductor device that includes a semiconductor substrate having electronic devices formed on the front surface thereof, a supporting substrate made of a single crystal semiconductor and attached to the semiconductor substrate, an adhesive layer attaching the supporting substrate to the semiconductor substrate, a protection film covering a back surface and a side surface of the semiconductor substrate and covering a portion of a side surface of the supporting substrate. In the plan view of the semiconductor device, the side surface of the supporting substrate extends along a direction that is not parallel with a cleavage plane of the supporting substrate, and a lateral width of the supporting substrate is greater than a lateral width of the semiconductor substrate so that the side surface of the supporting substrate defines a lateral edge of the semiconductor device. The supporting substrate may be made of a single crystal silicon and formed by cutting along a cleavage plane.

DETAILED DESCRIPTION OF THE INVENTION

An embodiment of the invention will be described referring to figures. FIGS. 1 and 2, and FIGS. 5 to 8 are cross-sectional views showing a semiconductor device and a method of manufacturing the same of the embodiment, and show a region for forming one of a plurality of semiconductor devices which are to be formed on a wafer-shaped semiconductor substrate 10 and a supporting substrate 14.

Figure 3A:
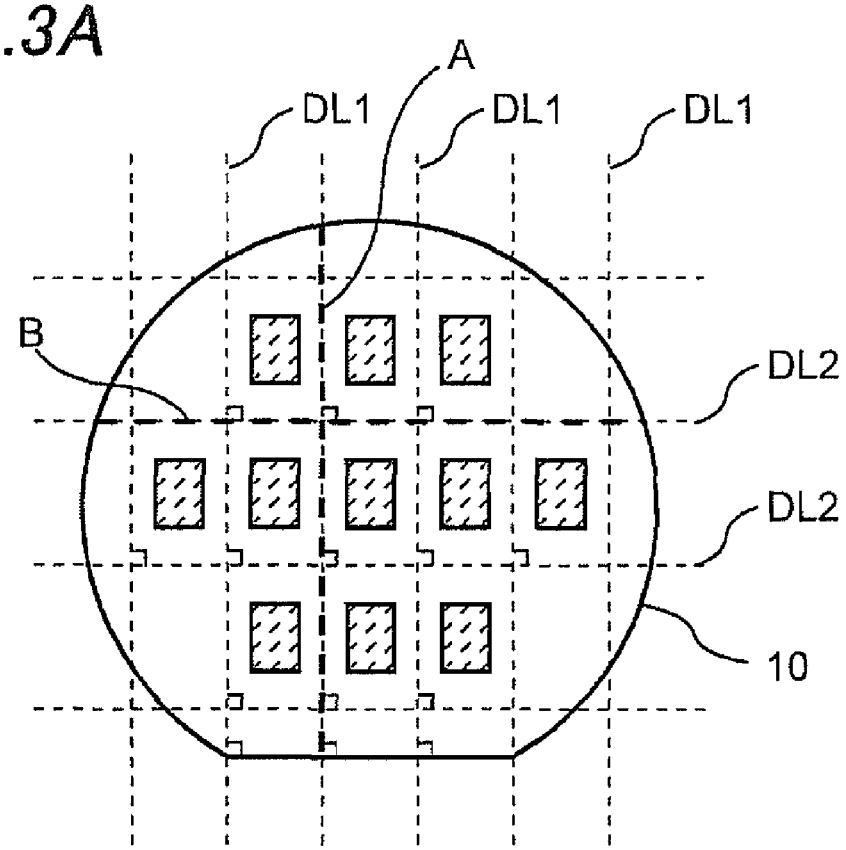
FIGS. 3A and 3B are plan views showing the semiconductor device and the method of manufacturing the same of the embodiment of the invention.
Figure 3B:
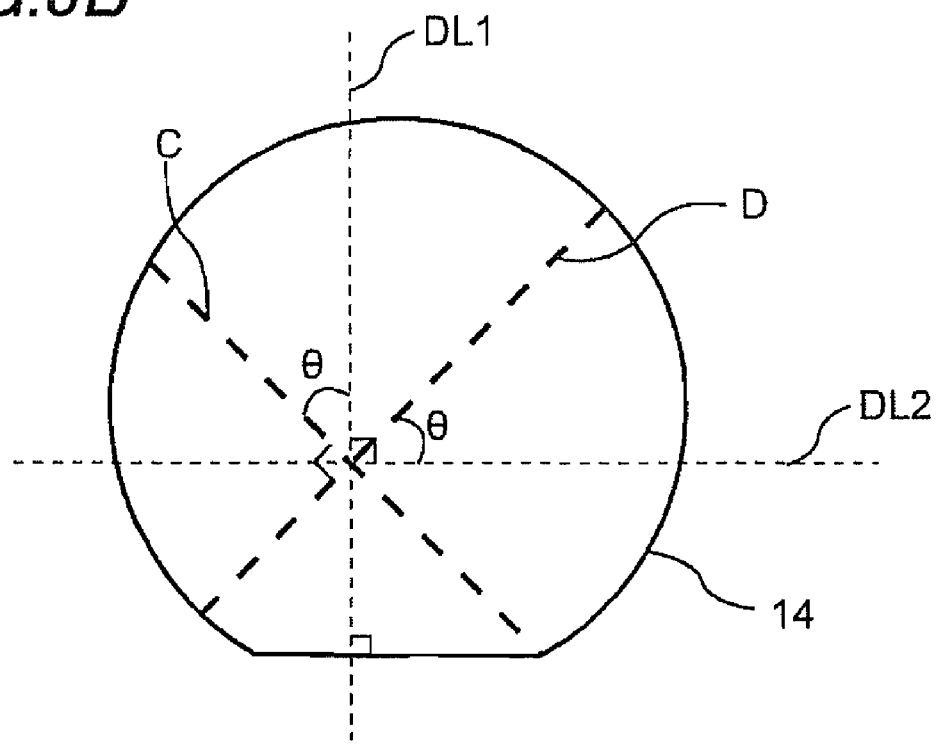
Figure 4:
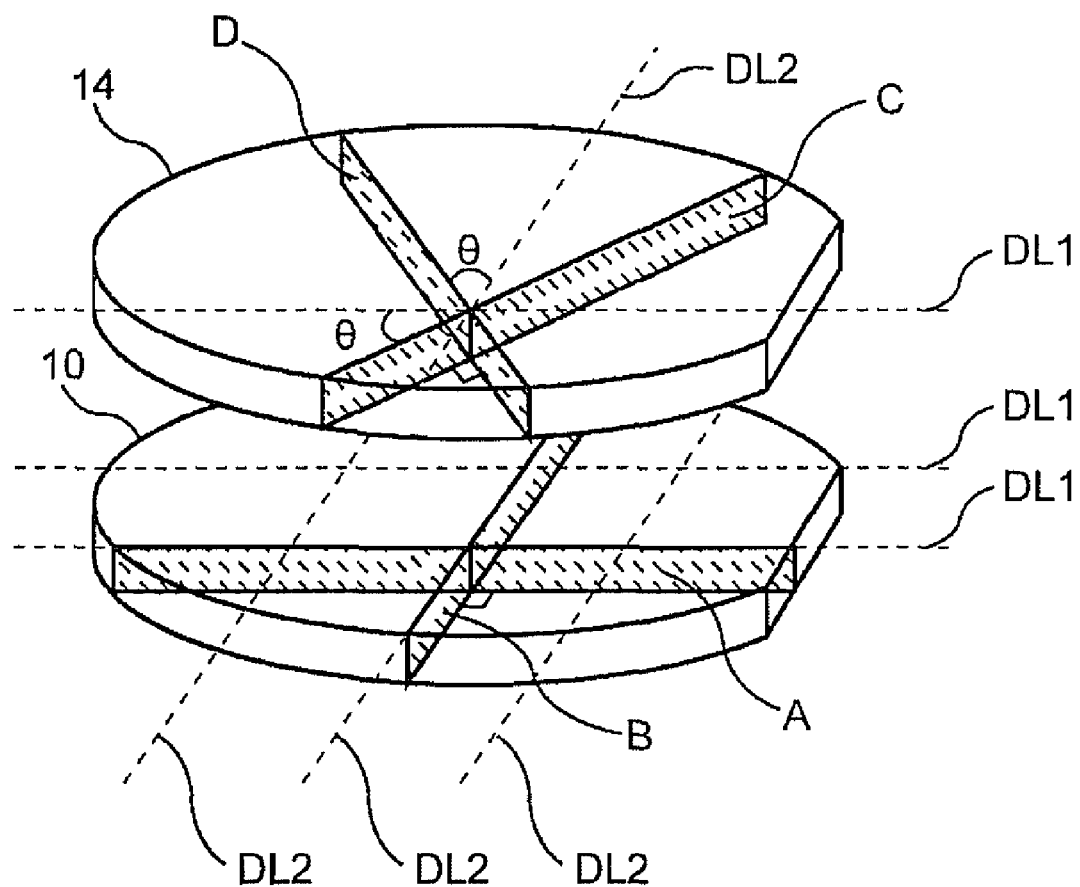
FIGS. 4 and 9 are perspective views showing the semiconductor device and the method of manufacturing the same of the embodiment of the invention.

FIGS. 3A and 3B are plan views showing the semiconductor device and the method of manufacturing the same of the embodiment, which show the wafer-shaped semiconductor substrate 10 and the supporting substrate 14, respectively. FIG. 4 is a perspective view showing the semiconductor substrate 10 and the supporting substrate 14 of FIGS. 3A and 3B.

Figure 1:
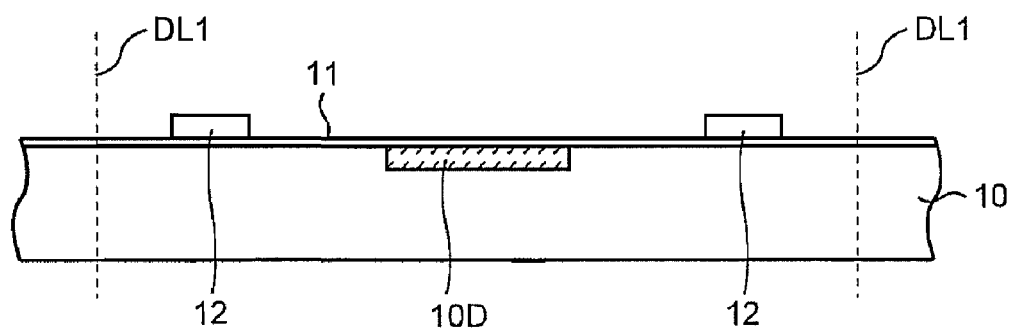
FIGS. 1, 2, and 5 to 8 are cross-sectional views showing a semiconductor device and a method of manufacturing the same of an embodiment of the invention.

This semiconductor device is a semiconductor device in which the supporting substrate 14 made of single crystal silicon is attached to the semiconductor substrate 10 formed with an electronic device 10D such as a transistor. Hereafter, the method of manufacturing this semiconductor device will be described. First, as shown in FIG. 1, the semiconductor substrate made of, for example, single crystal silicon having a thickness of about 100 to 700 μm is provided. As shown in FIG. 3A, the electronic device 10D is disposed in each of regions surrounded by dicing lines DL1 and dicing lines DL2 crossing perpendicularly thereto on the front surface of the semiconductor substrate 10.

In order to form the electronic device 10D such as a transistor properly, it is preferable that the front surface of the semiconductor substrate 10 formed with the electronic device 10D is parallel with one cleavage plane of the semiconductor substrate 10. Furthermore, in order to perform dicing easily in a subsequent process, it is preferable that the dicing lines DL1, DL2 are parallel with other cleavage planes crossing this cleavage plane at a predetermined angle, for example, perpendicularly.

The cleavage plane means a plane of a crystal lattice structure where bonding force between atoms between the crystallographic planes is weaker than those with respect to other crystallographic planes. For example, when the semiconductor substrate 10 is made of single crystal silicon, the cleavage plane is the plane of a face-centered cubic lattice structure which is the crystal lattice structure of single crystal silicon, where the bonding force between the atoms is the weakest. In this case, supposing that the cleavage plane which is parallel with the front surface of the semiconductor substrate 10 formed with the electronic device 10D is a first cleavage plane (100), there exist other cleavage planes of the semiconductor substrate 10 which are perpendicular to the first cleavage plane (100), i.e., a second cleavage plane A (010) and a third cleavage plane B (001) crossing perpendicularly thereto. All the first cleavage plane (100), second cleavage plane A (010) and third cleavage plane B (001) are crystal plane {100} when expressed as crystal planes of symmetry.

In order to easily align the semiconductor substrate 10 with the dicing lines DL1, DL2, it is preferable that the orientation flat of the semiconductor substrate 10 is formed so as to cross the dicing lines DL1 perpendicularly, i.e., to be parallel with the dicing lines DL2.

Then, as shown in FIG. 1, an insulation film 11 made of a BPSG film having a thickness of, for example, about 0.5 to 1.5 μm is formed on the front surface of the semiconductor substrate 10 so as to cover the electronic device 10D. Pad electrodes 12 electrically connected to the electronic device 10D are formed on the insulation film 11. The pad electrodes 12 are formed near two ends of the electronic device 10D, for example, but these may be formed in other positions instead. The following description is given using an embodiment where the pad electrodes 12 are formed near the two ends of the electronic device 10D.

A passivation film (not shown) made of a silicon nitride film or the like is further formed on the insulation film 11 so as to cover the pad electrodes 12.

Figure 2:
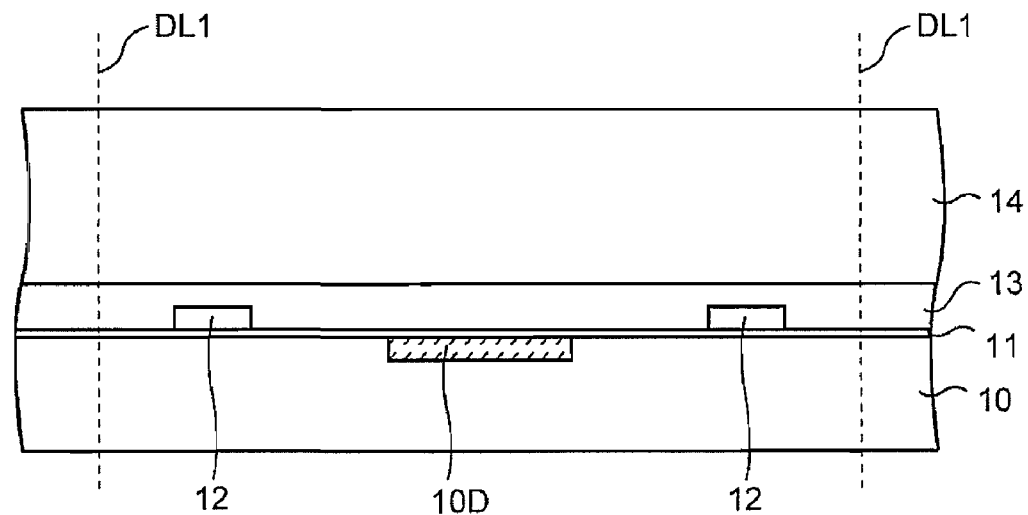

Then, as shown in FIG. 2, an adhesive layer 13 is formed on the passivation film (not shown) by coating an adhesive containing organic resign or the like. The supporting substrate 14 made of single crystal silicon is attached to the front surface of the semiconductor substrate 10 so as to face it with the adhesive layer 13 being interposed therebetween. The supporting substrate 14 is about 100 to 800 μm, and preferably about 400 μm in thickness.

At this time, the surface of the supporting substrate 14 facing the semiconductor substrate 10 is parallel with one cleavage plane of the supporting substrate 14. Supposing this cleavage plane to be a fourth cleavage plane (100), corresponding to the face-centered cubic lattice structure of single crystal silicon, there exist other cleavage planes in the supporting substrate 14 which are perpendicular to the fourth cleavage plane (100), i.e., a fifth cleavage plane C (010) and a sixth cleavage plane D (001) crossing perpendicularly thereto, as shown in FIG. 3B. All the fourth cleavage plane (100), fifth cleavage plane C (010) and sixth cleavage plane D (001) belong to crystal plane {100} when expressed as crystal planes of symmetry.

Differing from the semiconductor substrate 10, the supporting substrate 14 attached to the semiconductor substrate 10 has a positional relation such that the dicing lines DL1, DL2 are not parallel with the fifth cleavage plane C (010) and the sixth cleavage plane D (001) crossing perpendicularly thereto of the supporting substrate 14. In other words, angles θ made by the dicing lines DL1, DL2 and the fifth cleavage plane C (010) and the sixth cleavage plane D (001) on the surface of the supporting substrate 14 facing the semiconductor substrate 10 are larger than 0 degree, respectively. In detail, the angles θ are about 5 to 45 degrees, and preferably about 45 degrees, respectively. In the example figures and the following description, the angles θ are supposed to be about 45 degrees, respectively. A perspective view showing a relation between this semiconductor substrate 10 and the supporting substrate 14 is shown in FIG. 4.

It is preferable that the orientation flat of the supporting substrate 14 corresponds to the orientation flat of the semiconductor substrate 10 and is formed perpendicular to the dicing lines DL1, i.e., parallel with the dicing lines DL2. The following description is given supposing the orientation flats to be formed as described above.

Figure 5:
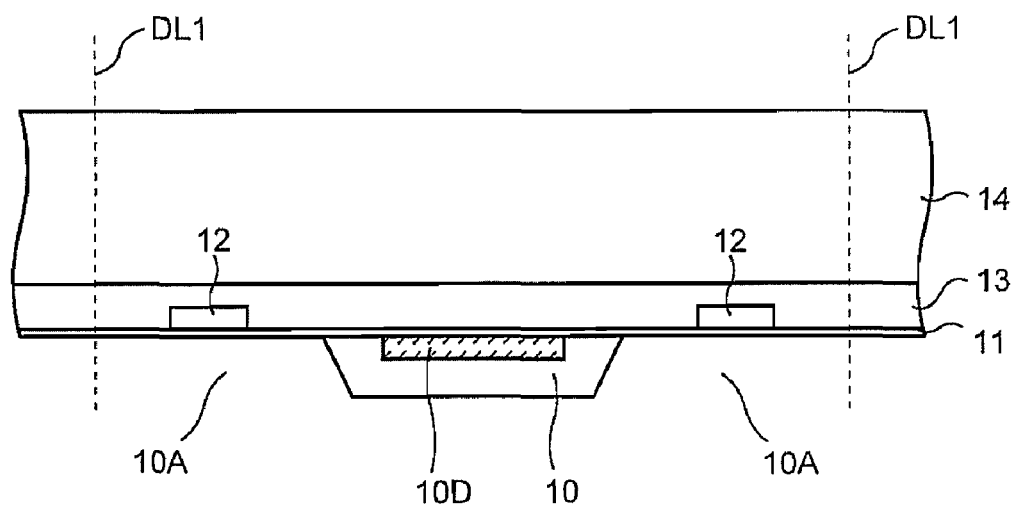

Then, as shown in FIG. 5, back surface grinding is performed to the semiconductor substrate 10 attached to the supporting substrate 14 to decrease the thickness to 10 to 150 μm, for example. Furthermore, a part of the semiconductor substrate 10 in a region including on the dicing lines DL1, DL2 and on the pad electrodes 12 is etched and removed. By this, street-like openings 10A along the dicing lines DL1, DL2 are formed in the semiconductor substrate 10, and the insulation film 11 is exposed in these openings 10A.

The sidewalls of the semiconductor substrate 10 in the openings 10A are preferably formed to be tapered toward the supporting substrate 14. This enhances the coverage of layers formed to cover the semiconductor substrate 10 and the supporting substrate 14 in subsequent processes.

Figure 6:
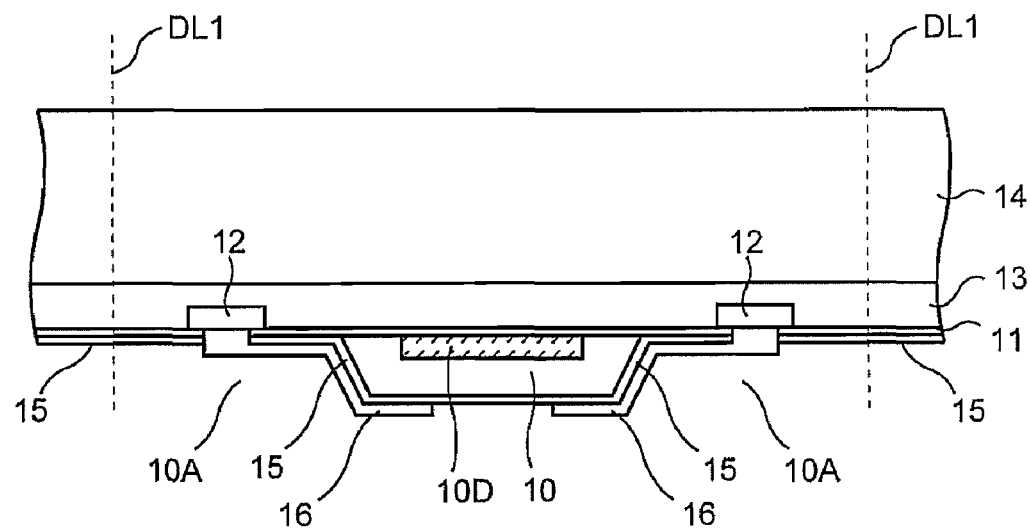

Then, as shown in FIG. 6, an insulation film 15 is formed so as to cover the back surface of the semiconductor substrate 10 to the openings 10A. The insulation films 11, 15 are then partially etched to expose the pad electrodes 12 partially, and wirings 16 are formed on the insulation film 15 so as to be connected to the exposed pad electrodes 12 and extend onto the back surface of the semiconductor substrate 10.

Figure 7:
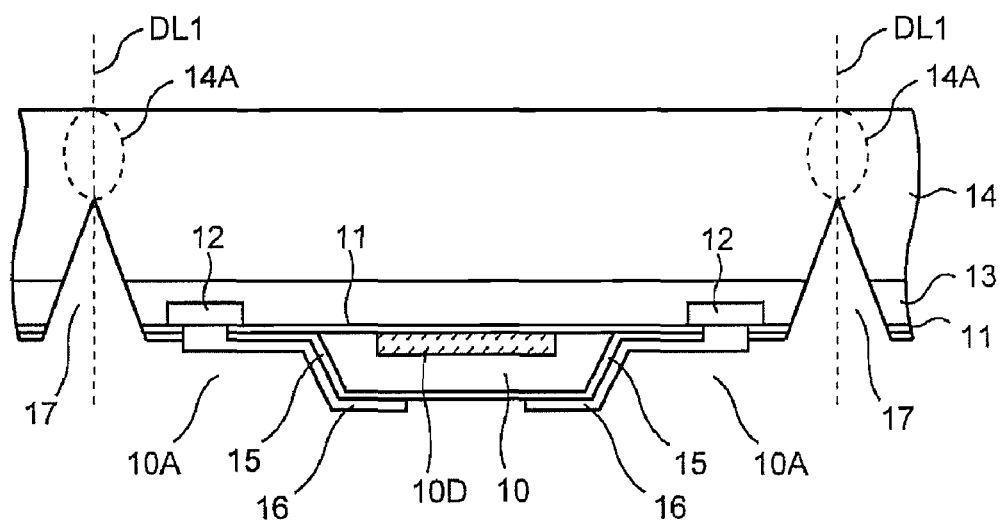

Then, as shown in FIG. 7, by cutting with a dicing blade or the like (not shown), grooves 17 are formed in the supporting substrate 14 from the surface facing the semiconductor substrate 10 to the middle thereof in the direction perpendicular to the front surface, along the dicing lines DL1, DL2 running inside the openings 10A. In the example figure, the description is given supposing the grooves 17 to be formed by cutting with a dicing blade (not shown), but these may be formed by other method, for example, by cutting by etching, laser irradiation or the like.

The groove 17 has a shape of which the width is smaller in a deeper position, and has a depth of about 20 to 100 µm, and preferably about 50 µm. At this time, the dicing lines DL1, DL2 are positioned so as not to be parallel with the fifth cleavage plane C (010) and the sixth cleavage plane D (001) crossing perpendicularly thereto of the supporting substrate 14. Therefore, the grooves 17 are also formed so as not to be parallel with the fifth cleavage plane C (010) and the sixth cleavage plane D (001) of the supporting substrate 14, in the similar manner to the dicing lines DL1, DL2. In other words, on the surface of the supporting substrate 14 facing the semiconductor substrate 10, i.e., on the fourth cleavage plane (100), the angles θ made by the extending direction of the grooves 17 and the fifth cleavage plane C (010) and the sixth cleavage plane D (001) are larger than 0 degree, respectively. In detail, the angles θ are about 5 to 45 degrees, and preferably about 45 degrees, respectively.

In this manner, since the grooves 17 do not correspond to the fifth cleavage plane C (010) and the sixth cleavage plane D (001) of the supporting substrate 14, when the grooves 17 are formed, a region 14A of the supporting substrate 14 which is on an extension of the tip of the groove 17 is prevented from cracking due to stress by contact of a dicing blade (not shown) to cause a fracture separating the supporting substrate 14. The fracture along the groove 17 of the supporting substrate 14 is also prevented from occurring not only due to the stress by the contact of the dicing blade but also due to some stress occurring in the supporting substrate 14 in the process of forming the grooves 17 and in subsequent processes, for example, stress during handling.

Furthermore, the fracture separating the supporting substrate 14 is also prevented even when some stress occurs in the supporting substrate 14 in the process of forming the grooves 17 and in subsequent processes even in a case of forming the grooves 17 by other method than the method using a dicing blade, for example, by cutting by etching, laser irradiation or the like, for the same reason as described above.

Figure 8:
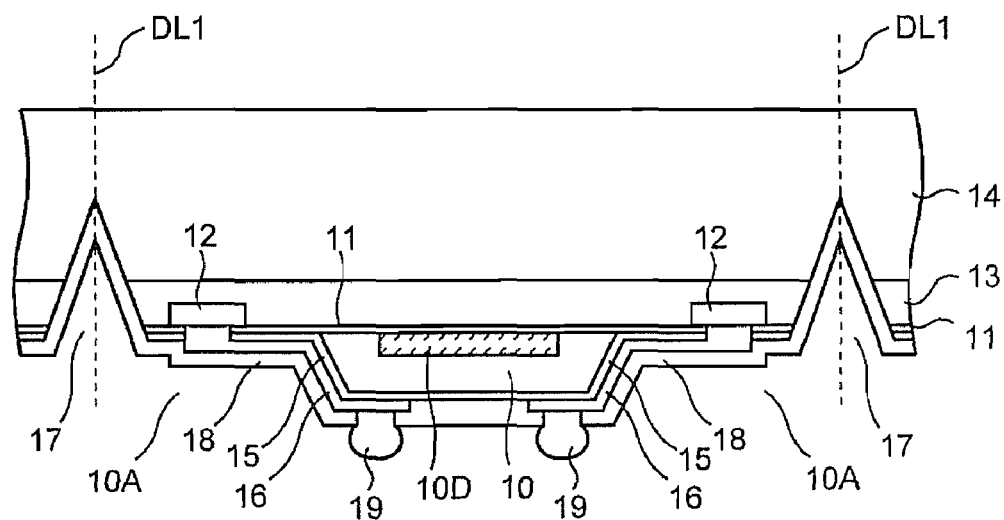
Figure 9:
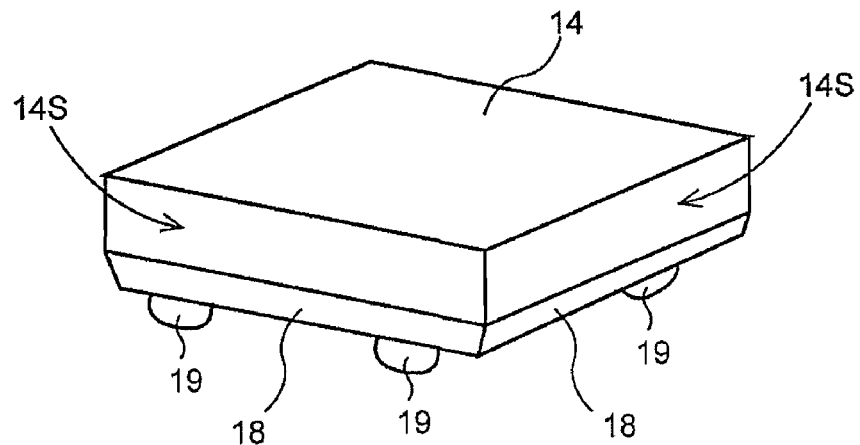
Figure 10:
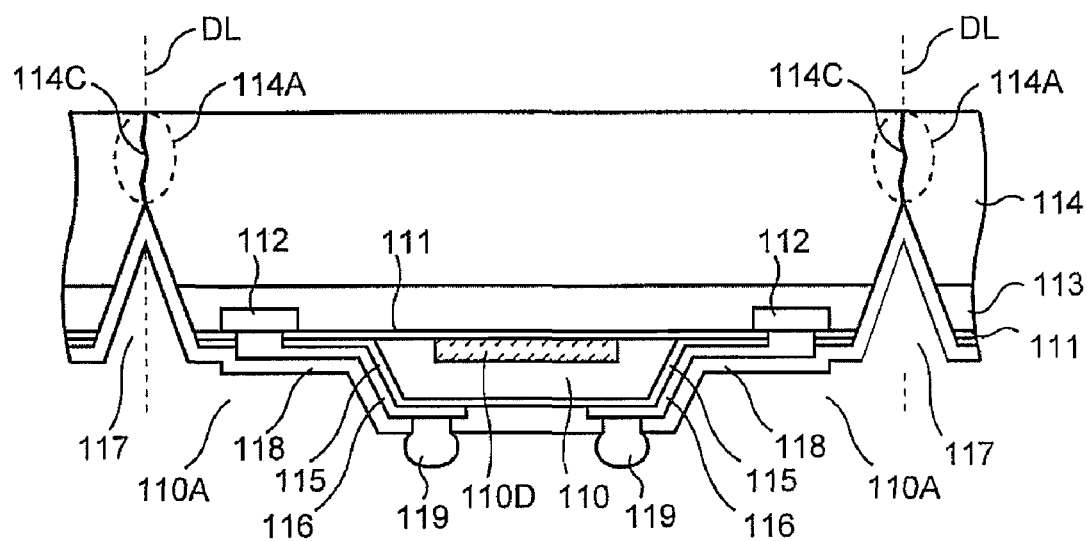
FIG. 10 is a cross-sectional view showing a conventional semiconductor device and a conventional method of manufacturing the same.

Then, as shown in FIG. 8, as the process after the formation of the grooves 17, a protection film 18 is formed so as to cover the back surface of the semiconductor substrate 10 to the grooves 17. Bump electrodes 19 are then formed so as to be connected to the wirings 16 through openings provided in the protection film 18. Then, the layered body of the layers from the semiconductor substrate 10 to the supporting substrate 14 is diced along the dicing lines DL1, DL2 and separated into a plurality of semiconductor devices. In the side surfaces of the separated semiconductor device, each of the side surfaces 14S of the supporting substrate 14 does not correspond to the fifth cleavage plane C (010) and the sixth cleavage plane D (001) as shown in a schematic perspective view of FIG. 9. It is noted that the fourth cleavage plane corresponds to the surface of the supporting substrate 14 facing the semiconductor substrate 10.

In the semiconductor device thus completed, since the protection film 18 is formed so as to cover the ends of the layers of the semiconductor device from the semiconductor substrate 10 to a part of the side surfaces 14S of the supporting substrate 14, this prevents water from entering the semiconductor device, and also prevents damage such as separation or the like at the end portion of the semiconductor device due to an impact or contact from outside.

Furthermore, in the method of manufacturing the semiconductor device described above, since the state of the supporting substrate 14 formed with the grooves 17 but not cut off is maintained more firmly than conventional in the processes before the dicing, the processes after the formation of the grooves 17, i.e., the process of forming the protection film 18 described above and so on are performed without fail. As a result, the reliability and yield of the semiconductor devices are enhanced.

It is noted that the invention is not limited to the embodiment described above, and modifications are possible within the scope of the invention.

For example, in the embodiment described above, all the fourth cleavage plane, fifth cleavage plane C (010) and sixth cleavage plane D (001) of the supporting substrate 14 belong to crystal plane {100} when expressed as crystal planes of symmetry, but the invention is not limited to this. In detail, the invention is also applicable to a case that at least one of cleavage planes of a supporting substrate is not a crystal plane of symmetry {100} as long as the device uses a supporting substrate having a cleavage plane from the front surface side to the back surface side. Furthermore, the invention is also applicable to a case that the surface of the supporting substrate 14 facing the semiconductor substrate 10 is not parallel with one of the cleavage planes of the supporting substrate 14, i.e., the fourth cleavage plane (100). Furthermore, the supporting substrate 14 may be made of other semiconductor than silicon as long as it has a cleavage plane from the front surface side to the back surface side.

Furthermore, although the semiconductor substrate 10 formed with the electronic device 10D is made of silicon in the embodiment described above, the invention is not limited to this. In detail, the invention is also applicable to a case of using a semiconductor substrate made of other semiconductor than silicon, for example, a compound semiconductor containing gallium and arsenic, as the semiconductor substrate formed with the electronic device 10D.

Furthermore, although the grooves 17 are formed in the supporting substrate 14 in the embodiment described above, the invention is not limited to this. In detail, the invention is also applicable to a semiconductor device in which a groove is formed in other semiconductor substrate than a supporting substrate and a method of manufacturing the same, as long as the groove is formed in the semiconductor substrate made of silicon from the front surface to the middle in the direction perpendicular to the front surface in a process before dicing, followed by other processes in this state and then dicing.

In this case, too, when the grooves are formed in the semiconductor substrate, a region of the semiconductor substrate which is on an extension of the tip of the groove is prevented from cracking due to stress by contact of a dicing blade (not shown) to cause a fracture. The fracture along the groove of the semiconductor substrate is also prevented from occurring not only due to the stress by the contact of the dicing blade but also due to some stress occurring in the semiconductor substrate in the process of forming the grooves and in subsequent processes, for example, stress during handling.

Furthermore, the fracture is prevented even when some stress occurs in the semiconductor substrate in the process of forming the grooves and in subsequent processes even in a case of forming the grooves by other method than the method using a dicing blade, for example, by cutting by etching, laser irradiation or the like, for the same reason as described above.

The invention prevents a fracture occurring in a supporting substrate along a groove formed in the supporting substrate in processes before dicing. This results in enhancement of the yield of semiconductor devices.

What is claimed is:

1. A semiconductor device comprising:
    a semiconductor substrate comprising electronic devices formed on a front surface thereof;
    a supporting substrate made of a single crystal semiconductor and attached to the semiconductor substrate;
    an adhesive layer attaching the supporting substrate to the semiconductor substrate;
    a protection film covering a back surface and a side surface of the semiconductor substrate and covering a portion of a side surface of the supporting substrate,
    wherein in plan view of the semiconductor device the side surface of the supporting substrate extends along a direction that is not parallel with a cleavage plane of the supporting substrate, and
    a lateral width of the supporting substrate is greater than a lateral width of the semiconductor substrate so that the side surface of the supporting substrate defines a lateral edge of the semiconductor device.

2. A semiconductor device comprising:
    a semiconductor substrate comprising electronic devices formed on a front surface thereof;
    a supporting substrate made of a single crystal silicon and attached to the semiconductor substrate;
    an adhesive layer attaching the supporting substrate to the semiconductor substrate;
    a protection film covering a back surface and a side surface of the semiconductor substrate and covering a portion of a side surface of the supporting substrate,
    wherein a front surface and a back surface of the supporting substrate correspond to a cleavage plane of the single crystal silicon,
    in plan view of the semiconductor device the side surface of the supporting substrate extends along a direction that is not parallel with a cleavage plane of the single crystal silicon, and
    a lateral width of the supporting substrate is greater than a lateral width of the semiconductor substrate so that the side surface of the supporting substrate defines a lateral edge of the semiconductor device.

3. The semiconductor device of claim 2, wherein the extending direction of the side surface of the supporting substrate and one of cleavage planes makes an angle of 5 to 45 degrees in the plan view of the semiconductor device.

* * * * *